US 8,604,785 B2

(12) United States Patent
Deimling et al.

(10) Patent No.: US 8,604,785 B2
(45) Date of Patent: Dec. 10, 2013

(54) MAGNETIC RESONANCE METHOD AND SYSTEM TO CREATE AN IMAGE DATA SET

(75) Inventors: Michael Deimling, Moehrendorf (DE); David Grodzki, Hannover (DE)

(73) Assignee: Siemens Aktiengesellschaft, Munich (DE)

( * ) Notice: Subject to any disclaimer, the term of this patent is extended or adjusted under 35 U.S.C. 154(b) by 465 days.

(21) Appl. No.: 13/040,426

(22) Filed: Mar. 4, 2011

(65) Prior Publication Data

US 2011/0215804 A1 Sep. 8, 2011

(30) Foreign Application Priority Data

Mar. 4, 2010 (DE) .................... 10 2010 010 196

(51) Int. Cl.
*G01R 33/44* (2006.01)

(52) U.S. Cl.
USPC .......................... 324/307; 324/309

(58) Field of Classification Search
USPC ........................................ 324/307
See application file for complete search history.

(56) References Cited

U.S. PATENT DOCUMENTS

| 5,777,472 A | 7/1998 | Heid |
| 2007/0080685 A1 | 4/2007 | Bydder et al. |
| 2011/0187368 A1* | 8/2011 | Grodzki ................. 324/309 |
| 2012/0081113 A1* | 4/2012 | Grodzki ................. 324/309 |

OTHER PUBLICATIONS

"Single Point Sequences with Shortest Possible TE-GOSPEL," Grodzki et al., Siemens Healthcare.
"Magnetic Resonance Imaging Physical Principles and Sequence Design," Haacke et al. (1999) pp. 234-239.
"Rapid Single Point (RASP) Imaging," Heid et al., Institute of Diagnostic Radiology, University of Bern, 3rd Annual Meeting (1995) p. 684.

* cited by examiner

*Primary Examiner* — Melissa Koval
*Assistant Examiner* — Rishi Patel
(74) *Attorney, Agent, or Firm* — Schiff Hardin LLP

(57) ABSTRACT

In a method to create an image data set by operating a magnetic resonance system, at least two phase coding gradients are switched in respective spatial directions, an RF excitation pulse is radiated and a raw data point in a k-space data set belonging to the image data set is read out a predetermined time period after the radiation of the RF excitation pulse. The predetermined time period thereby corresponds to the maximum of a set of a respective minimum time period for each of the at least two phase coding gradients. The minimum time period of the respective at least one of the at least two phase coding gradients is determined depending on the strength of the respective phase coding gradient such that the Nyquist theorem is complied with.

32 Claims, 5 Drawing Sheets a) (PRIOR ART)

b) (PRIOR ART)

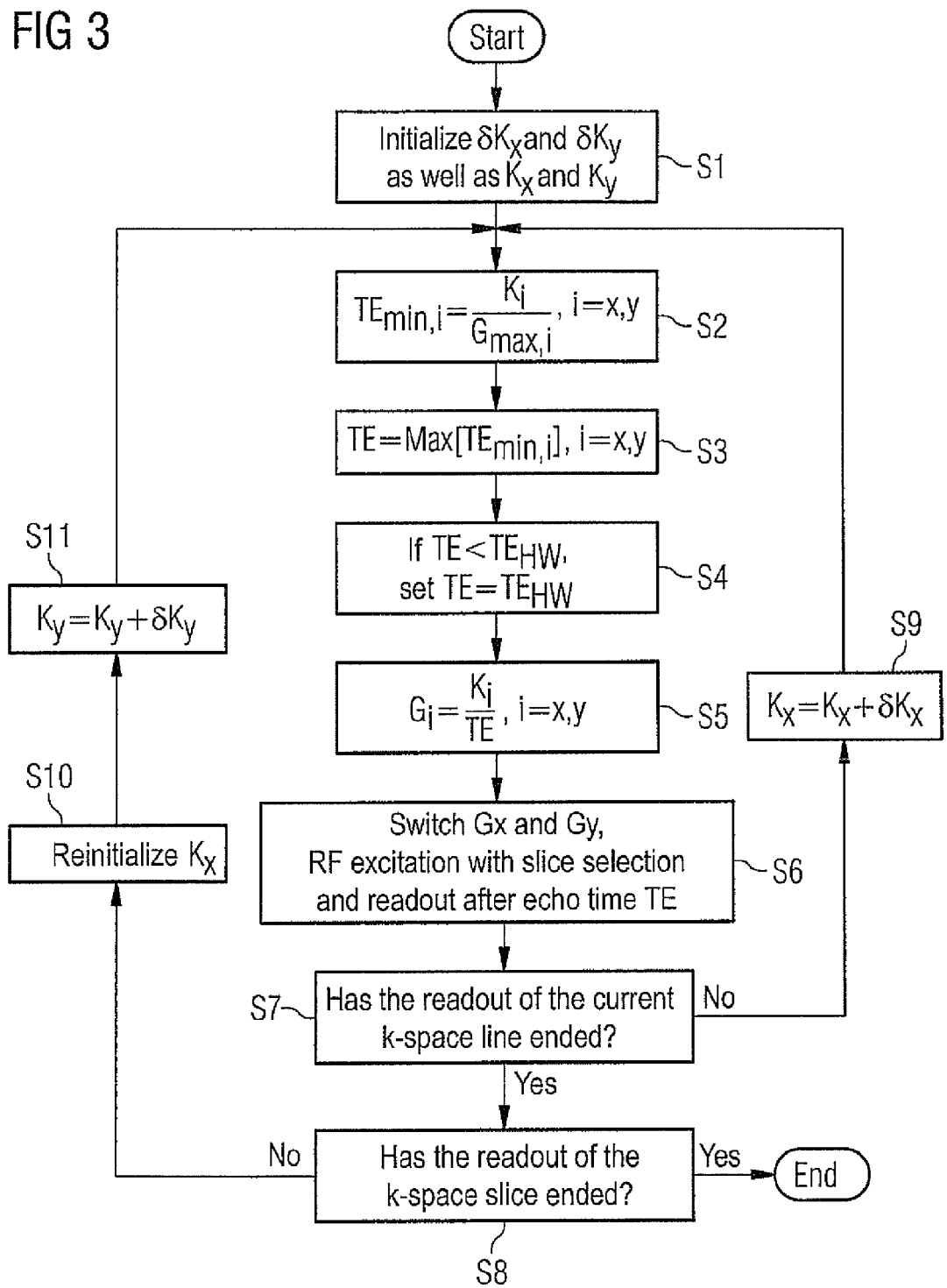

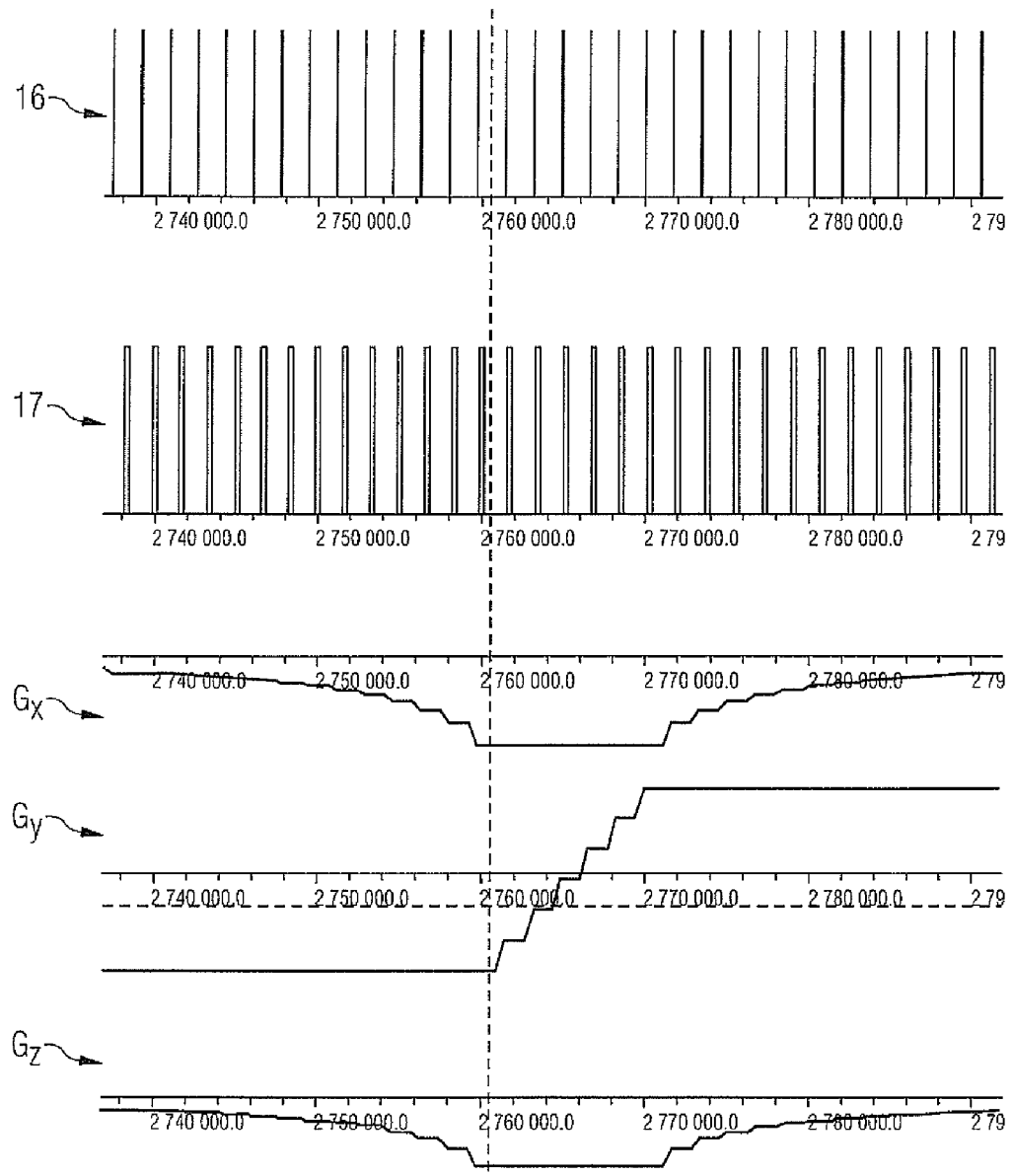

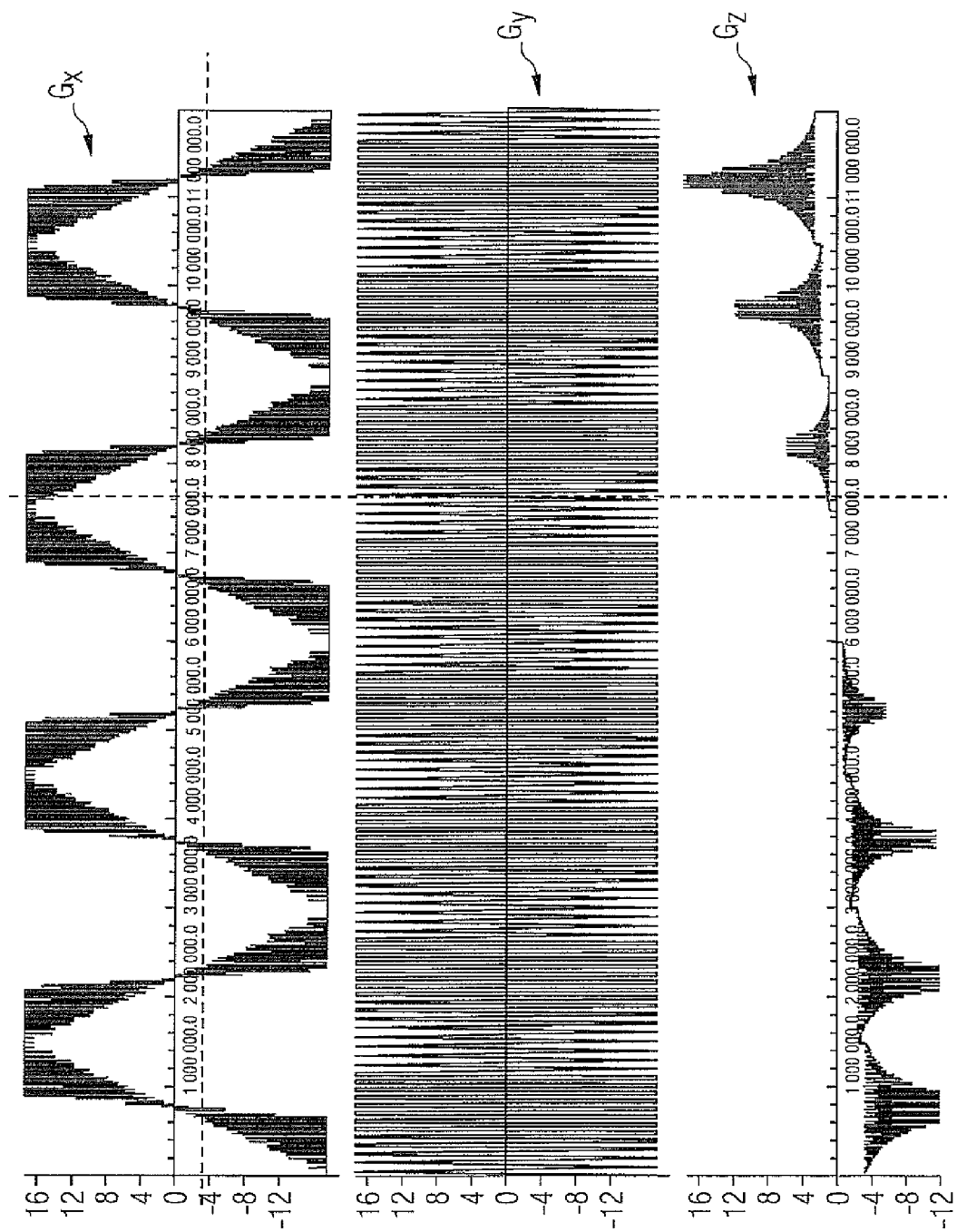

MAGNETIC RESONANCE METHOD AND SYSTEM TO CREATE AN IMAGE DATA SET

BACKGROUND OF THE INVENTION

1. Field of the Invention

The present invention concerns methods to create an image data set by means of a magnetic resonance (MR) system. Moreover, the present invention concerns correspondingly designed magnetic resonance systems and a corresponding electronically readable data storage medium.

2. Description of the Prior Art

Physical principles of MR imaging—the Nyquist theorem, among other things—are described in "Magnetic Resonance Imaging Physical Principles and Sequence Design".

DE 44 23 806 C1 describes an MR image acquisition via a series of individual measurements.

US 2007/0080685 A1 discloses MR imaging techniques and a system which operate with ultra-short echo times.

New fields of application in magnetic resonance tomography are offered by an acquisition of MR data with very short echo times (<500 μs). It is thereby possible to show substances or tissue which cannot be shown by means of conventional sequences—for instance a (T)SE sequence ("(Turbo) Spin Echo") or a GRE sequence ("Gradient Echo")—since their T2 time is markedly shorter than the echo time and thus a corresponding signal from these substances or tissues has already decayed at the point in time of acquisition. For example, with echo times in the range of the corresponding decay time, it is possible to show bones, teeth or ice in an MR image even though the T2 time of these subjects is in a range from 30-80 μs.

Sequences are known that enable a very short echo time. In addition to the radial UTE sequence ("Ultrashort Echo Time") there is the approach to scan k-space at points in that the free induction decay (FID) is detected. Such a method is also designated as single point imaging since essentially only one raw data point or, respectively, k-space point in k-space is detected per RF excitation.

One example of such a method for single point imaging is the RASP method ("Rapid Signal Point (RASP) Imaging", O. Heid, M. Deimling, SMR, 3rd Annual Meeting, Page 684, 1995). According to the RASP method, a raw data point in k-space whose phase was coded by gradients is read out at a fixed point in time after the RF excitation relative to the "echo time" TE. The gradients are modified by means of the magnetic resonance system for each raw data point or measurement point and k-space is thus scanned point-by-point, as is shown in FIGS. 1a and 1b herein.

SUMMARY OF THE INVENTION

An object of the present invention is to create an image data set with a magnetic resonance system, wherein the echo time is further reduced compared to known methods and systems.

In accordance with the present invention, a method is provided to create an image data set by means of a magnetic resonance system, which includes the following steps:

Switch (activate) two or three phase coding gradients to code the phase in a respective spatial direction. Two phase coding gradients are switched if, for example, a slice of k-space which is selected (by means of an RF excitation pulse, for example) is to be read out. Three phase coding gradients are used if all three spatial directions are phase-coded. The spatial directions are the three Cartesian spatial directions that are typically labeled as x-, y- and z-directions.

Radiate an RF excitation pulse.

Read out normally only one raw data point in k-space a specific time period after the radiation of the RF excitation pulse. The specific time period is the maximum of two or three time periods that are determined for the two or three phase coding gradients. The respective time period for the respective phase coding gradients is dependent on the resolution and the strength of the respective phase coding gradients, such that the Nyquist theorem (criterion) is adhered to.

A significant advantage of the present invention is that each raw data point is acquired with the minimum echo time that is determined for it individually. Because a constant echo time is not employed, as is typical according to the prior art, substances that could previously not be shown can now be shown in an MR image. Moreover, the time to acquire an MR image is advantageously shortened relative to the prior art.

Within the scope of the present invention, a method is also provided to create an image data set by means of a magnetic resonance system, which includes the following steps:

Switch three phase coding gradients along the three spatial directions.

Radiate an RF excitation pulse.

Read out multiple raw data points in k-space which lie on a straight spoke or line that runs through the center of k-space. Each of the raw data points is thereby read out a corresponding time period after the radiation of the RF excitation pulse. This time period is determined as a maximum of three time periods which are respectively calculated for three phase coding gradients of the respective raw data point that are determined for spatial coding of the corresponding raw data point. The time period of the respective phase coding gradient is determined depending on the resolution and the strength of the respective phase coding gradients such that the Nyquist theorem is adhered to. Expressed differently, the Nyquist theorem would be violated if the respective raw data point were to be read out earlier than the time period that is determined for it.

In this method according to the invention there is also the significant advantage that each raw data point is read out at an echo time determined for it that is defined by the Nyquist theorem. Since—as is shown in detail below—the time period after which the corresponding raw data point is read out normally depends on the strongest of the three phase coding gradients for this raw data point, given a radial readout method raw multiple data points lying on spokes running through the center of k-space can advantageously be acquired since the time periods or echo times that are to be complied with for the respective raw data points are differently dependent on the distance of the corresponding raw data point from the center.

The following Equation (1) must be satisfied in order to satisfy the Nyquist theorem:

$$K_{max,i} - K_{min,i} \geq \frac{\gamma \times N_i}{FoV_i} \quad (1)$$

wherein i is an index for one of the three spatial directions (x, y or z) and $K_{max,i}$ and $K_{min,i}$ respectively stand for the maximum and minimum gradient moment of the corresponding spatial direction. The gradient moment $K_i$ to be set to acquire a raw data point must lie between these two extreme values ($K_{min,i}$, $K_{max,i}$).

The following Equation (2) then normally applies for the step interval [step width] $\delta K_i$ of the gradient moment $K_i$ of the respective spatial direction:

$$\delta K_i = \frac{K_{max,i} - K_{min,i}}{(N_i - 1)} \quad (2)$$

The (minimum) time period $TE_{min,i}$ for the respective spatial direction is determined according to the following Equation (3):

$$TE_{min,i} = \frac{K_i}{G_{max,i}} \quad (3)$$

wherein i thereby again stands for an index for one of the three spatial directions (x, y or z). $K_1$ stands for the gradient moment in the corresponding spatial direction and $G_{max,i}$ corresponds to the maximum gradient strength in the spatial direction corresponding to the index i. This maximum gradient strength is for the most part equal in all spatial directions.

Since $G_{max,x}$, $G_{max,y}$, $G_{max,z}$ are constant, the echo time to be complied with (i.e. the time period after the RF excitation pulse at which the MR data for the raw data point are acquired) for the respective raw data point is determined significantly over two or three gradient moments.

In other words, $TE_{min,x}$ and $TE_{min,y}$ (and possibly $TE_{min,z}$) are determined according to the above Equation (3) and the maximum value of these two or three times is determined that corresponds to that echo time which elapses until the corresponding raw data point is scanned after the radiation of the RE excitation pulse.

In the first method according to the invention for the acquisition of the raw data point, or to acquire the multiple raw data points in the second method according to the invention, one of the phase coding gradients is set to a maximum strength. The maximum strength thereby corresponds in particular to the maximum possible strength of the magnetic resonance system. However, it is also possible to select the maximum strength to be less than the maximum possible strength.

Because one of the phase coding gradients is always switched to the maximum level (except in the center of k-space), in proximity to the k-space center the echo time specifically drops to a value limited by the hardware (by the magnetic resonance system) so that the depiction of bones is also possible, for example.

Starting from the echo time TE (which corresponds to the maximum of the minimum echo times of the spatial directions to be considered that are determined according to Equation (3)), the strength of each phase coding gradient $G_i$ is determined according to the following Equation (4):

$$G_i = \frac{K_i}{TE}, \quad (4)$$

wherein $K_i$ corresponds to the gradient moment of the corresponding spatial direction.

The phase coding gradients are advantageously already activated, meaning that they have their final (ultimate) value when the RF excitation pulse is radiated.

According to a further preferred embodiment according to the invention, the image data set is created as follows by means of the magnetic resonance system:

According to a method that is in the prior art, the two or three gradient moments for each raw data point are determined for each raw data point in k-space. For each spatial direction the minimum echo time of the corresponding spatial direction is determined step by step for each raw data point, depending on the respective gradient moment (see in particular Equation (3)). The maximum value of these two or three minimum echo times is then the (maximum) echo time. The strength of the phase coding gradients to be switched in the respective spatial direction is determined depending on the gradient moment of the respective spatial direction and this echo time (see in particular Equation (4)).

Since the minimum echo time is predetermined by the magnetic resonance system, this minimum echo time cannot be under-run. If a determination of the predetermined time period or echo time according to the procedure described in the preceding results in an echo time that is shorter than the minimum echo time predetermined by the magnetic resonance system, in spite of this the MR data are acquired at the minimum echo time after the radiation of the RF excitation pulse.

The embodiments described in the preceding apply to both variants of the method according to the invention.

The first method according to the invention and the second method according to the invention are compared in order to explain specific features.

While the second method according to the invention essentially simultaneously acquires multiple raw data points on a spoke running through the k-space center (i.e. acquires them with one RF excitation pulse), in the method according to the invention essentially only one raw data point is acquired with an RF excitation pulse. Since the simultaneously acquired raw data points lie on the same spoke in the additional method according to the invention, all raw data points have different strengths for each of their three phase coding gradients if it is assumed that the simultaneously acquired raw data points lie on the spoke on the same side of the k-space center. Due to the different strengths of their three phase coding gradients, the raw data points situated on the same spoke also have different echo times, such that the raw data points can be acquired at different times. Moreover, the ratio of the strengths of the phase coding gradients of a raw data point is constant for all raw data points on the same spoke (i.e. the ratios $G_x/G_y$, $G_x/G_z$ and $G_y/G_z$ are the same for all raw data points of the same spoke). If the three phase coding gradients of the raw data points that are to be acquired simultaneously are multiplied with the same factor, such that the respective strongest phase coding gradient has the maximum strength, all raw data points to be acquired simultaneously are spatially coded with the same switched phase coding gradients and can therefore advantageously be acquired with the same RF excitation pulse.

In a Cartesian scanning method (as can be used in the first method according to the invention, for example) the raw data points are acquired line by line, wherein essentially only one phase coding gradient changes between two adjacent raw data points. For this reason the situation frequently occurs that two adjacent raw data points have the same echo time since the weakest phase coding gradient (which determines the echo time) is the same for the adjacent raw data points. Therefore the two adjacent raw data points would have to be read out at the same time period after the RF excitation pulse, which is why they cannot be read out with the same RF excitation pulse in this case. Moreover, in a Cartesian scanning method the case seldom arises that the ratio of the phase coding gradients of two raw data points to be scanned in succession remains constant. Therefore in most cases two adjacent raw data points also cannot be acquired with the same phase coding gradients when these phase coding gradients have previously been multiplied with the same factor, such that the respective strongest phase coding gradient has the maximum gradient strength.

Within the scope of the present invention, a magnetic resonance system is also provided to create an image data set. The magnetic resonance system include an activation unit to activate a scanner of the magnetic resonance system, a receiver device to receive signals acquired by the scanner and a computerized evaluation device to evaluate the signals and to create the image data set. The magnetic resonance system has a computerized control unit designed to it activate two or three phase coding gradients in one of the three respective spatial directions, radiates an RF excitation pulse and acquires essentially only one raw data point in k-space a specific time period after the radiation of the RF excitation pulse. The magnetic resonance system evaluation device calculates or determines this time period in that it forms the maximum of two or three time periods which the magnetic resonance system control unit has previously determined for the two or three phase coding gradients. The two or three time periods of the respective phase coding gradients are thereby determined by the magnetic resonance system evaluation unit depending on the strength of the respective phase coding gradient, such that the Nyquist theorem is complied with.

Within the scope of the present invention, a magnetic resonance system is also provided to create an image data set. This magnetic resonance system also has an activation unit to activate a scanner of the magnetic resonance system, a receiver device to receive signals acquired by the scanner and an evaluation device to evaluate the signals and to create the image data set. The magnetic resonance system control unit activates three phase coding gradients, radiates an RF excitation pulse and acquires multiple raw data points in k-space. The raw data points thereby lie on a straight spoke which runs through the center of k-space. The magnetic resonance system reads out each of the raw data points at an individual time period after the radiation of the RF excitation pulse. The individual time period of the respective raw data point is the maximum value of the three time periods that are determined for one of three phase coding gradients used for spatial coding of the respective raw data point. The magnetic resonance system determines the time period for the respective one of the three phase coding gradients depending on the strength of the respective phase coding gradient, such that the Nyquist theorem is complied with.

The advantages of the first magnetic resonance system according to the invention and the second magnetic resonance system according to the invention essentially correspond to the advantages of the first method according to the invention and the second method according to the invention, which have been stated in detail above.

Furthermore, the present invention encompasses a non-transitory computer-readable storage medium forming a computer program product, in particular software, which can be loaded into a memory of a programmable controller or respectively, a computer of a magnetic resonance system. All or various embodiments of the methods according to the invention that are described in the preceding can be executed with this computer program product when the computer program product runs in the controller. The computer program product thereby possibly requires program means (for example libraries and auxiliary functions) in order to realize the corresponding embodiments of the method. In other words, the computer program product in particular is software with which any of the embodiments of the methods according to the invention that are described above can be executed. The software can be a source code (C++, for example) that must still be compiled and linked or that only must be interpreted, or can be an executable software code that is only to be loaded into the corresponding computer for execution.

The electronically readable data storage medium can be, for example, a DVD, a magnetic tape or a USB stick on which is stored electronically readable control information, in particular software (see above). All embodiments according to the invention of the methods described in the preceding can be implemented when this control information (software) is read from the data medium and stored in a controller or computer of a magnetic resonance system.

The present invention has the following advantages:

Very short echo times, essentially limited only by the hardware.

The possibility to be able to show substances or tissue with very short echo times.

A reduction of the measurement time in comparison to the RASP method since the repetition time can decrease with the echo time.

The present invention is suitable for methods of single point imaging, wherein essentially one raw data point is acquired per radiated RF excitation pulse. Given radial data acquisition methods, the present invention is also suitable to acquire multiple raw data points per RF excitation pulse. Naturally, however, the present invention is not limited to these preferred application fields since (for example) even given non-radial acquisition methods or, respectively, methods according to the invention multiple raw data points can be acquired with one RF excitation pulse if the Nyquist theorem is complied with per raw data point.

BRIEF DESCRIPTION OF THE DRAWINGS

The RASP method known according to the prior art is described using FIGS. 1a and 1b.

A flow chart of an embodiment according to the invention to create an image data set is shown in FIG. 3.

FIG. 4 shows a sequence to acquire multiple raw data points in a Cartesian-scanned k-space.

FIG. 5 shows the curve of the three phase coding gradients given the Cartesian acquisition of eight slices in k-space.

DESCRIPTION OF THE PREFERRED EMBODIMENTS

Figure 1:
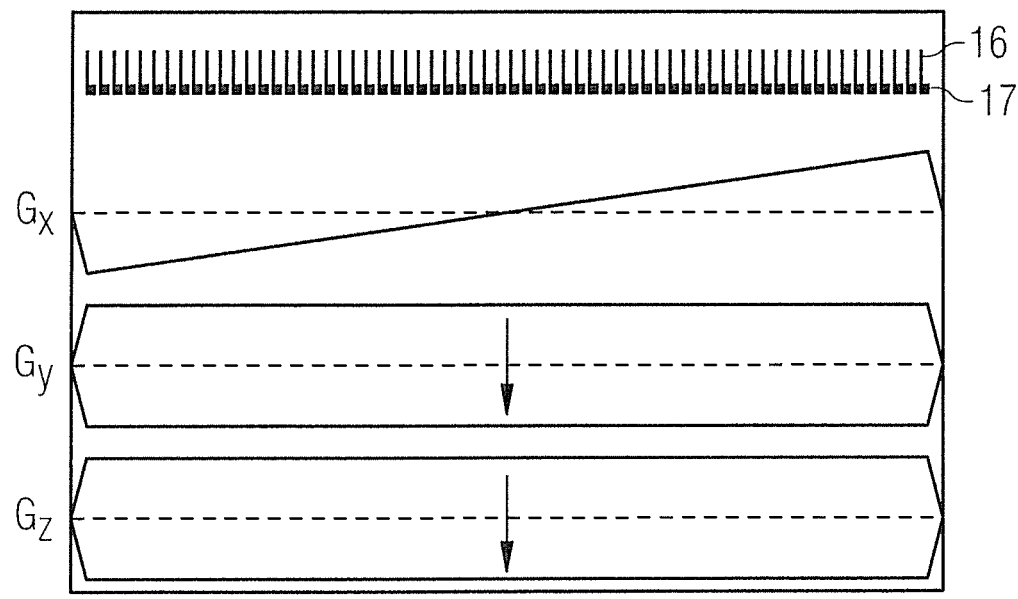
Figure 1:
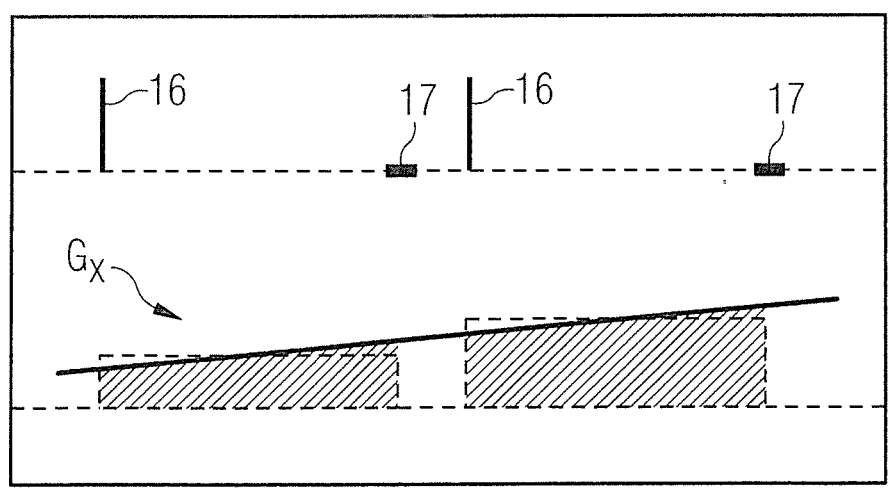

A known sequence to acquire a line in k-space is shown in FIG. 1a. It is apparent that the two phase coding gradients $G_y$ and $G_z$ are activated with a constant strength while the strength of the third phase coding gradient $G_x$ increases continuously.

The acquisition of two raw data points is shown in detail in FIG. 1b. It is apparent that the echo time (i.e. the time interval from the RF excitation pulse 16 up to the beginning of the readout time period 17) is constant. Moreover, the phase coding gradient $G_x$ proceeds in stages from bottom to top. The phase coding gradient $G_x$ is kept constant to read out a raw data point, which means that the phase coding gradient $G_x$ is kept constant for the time period TE (echo time).

Figure 2:
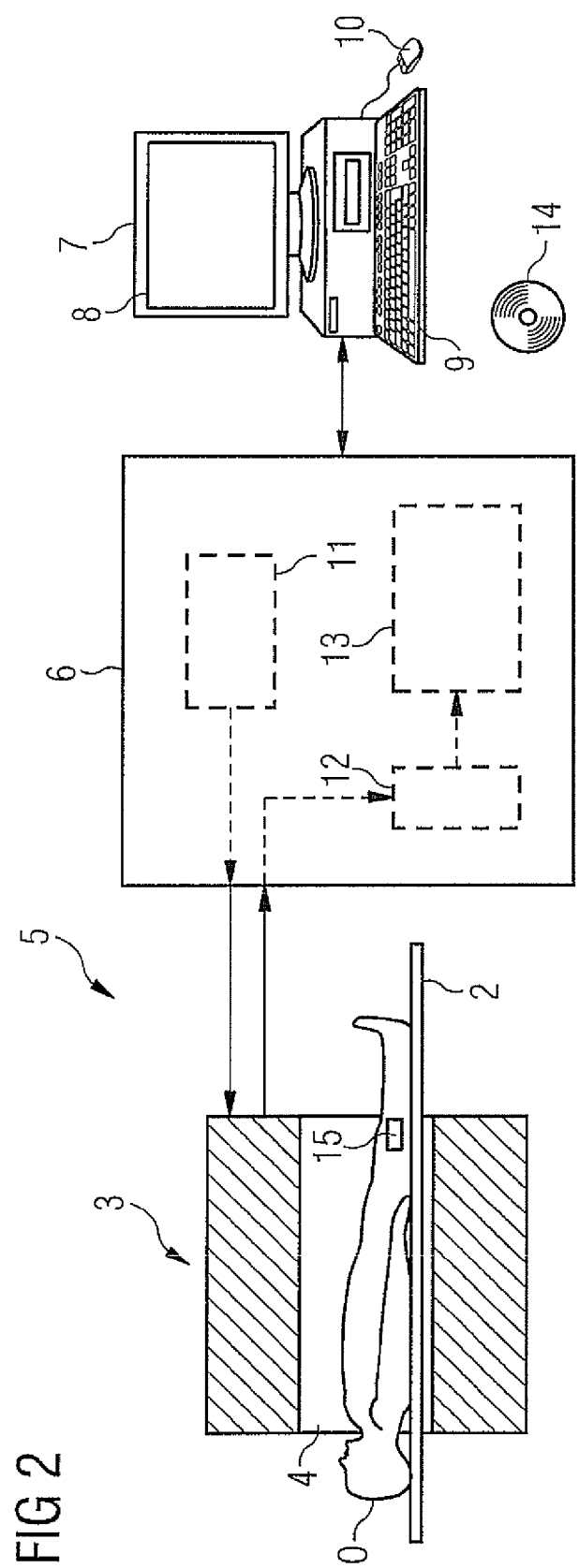
FIG. 2 schematically shows a magnetic resonance system according to the invention.

A magnetic resonance system 5 according to the invention is schematically shown in FIG. 2. The magnetic resonance system 5 includes a scanner (MR data acquisition unit) 3 with which the magnetic fields necessary for the MR examination are generated in a measurement space 4; a table 15; a control device 6 with which the scanner 3 is controlled and MR data of the scanner 3 are acquired; and a terminal 7 connected to the control device 6.

The control device 6 includes an activation unit 11, an acquisition device 12 and an evaluation device 13. For the generation of an image data set, MR data are acquired by the acquisition device 12 by means of the scanner 3, wherein the scanner 3 and the table 2 are activated by the activation unit 11 such that MR data are acquired in a measurement volume which is located inside the body of a patient O lying on the table 2.

The evaluation device 13 then prepares the data such that they can be graphically presented on a screen 8 of the terminal 7, and such that images created according to the invention (in particular difference images) are displayed. In addition to the graphical presentation of the MR data, a three-dimensional volume segment to be measured can be predetermined by a user and additional parameters for implementation of the method according to the invention can be determined with the terminal 7, which in addition to the screen 8 comprises a keyboard 9 and a mouse 10. The software for the control device 6 can also be loaded into the control device 6 via the terminal 7. This software of the control device 6 can also include the method according to the invention. It is also possible that a method according to the invention is contained in a software which runs in the terminal 7. Independent of in which software the method according to the invention is contained, the software can be stored on a DVD 14 so that this software can then be read from the DVD 14 by the terminal 7 and either be copied into the control device 6 or into a computer of the terminal 7 itself.

A flow chart for a method according to the invention to create an image data set by means of a magnetic resonance system 5 is shown in FIG. 3, wherein the shown flow chart describes the readout of a slice. The method shown in FIG. 3 operates with a slice selection so that only two phase coding gradients $G_x$ and $G_y$ are used for spatial coding within the selected slice.

In the first Step S1 the step intervals [step sizes] $\delta K_x$ and $\delta K_y$ are initialized and the gradient moments $K_x$ and $K_y$ for the first raw data point to be acquired in k-space are initialized.

$TE_{min,x}$ and $TE_{min,y}$ are determined in a second Step S2 in that the gradient moment $K_x$ or, respectively, $K_y$ is divided by the maximum gradient strength $G_{max,x}$ or, respectively, $G_{max,y}$ of the corresponding spatial direction.

According to Step S3, the greater value (or the maximum) of $TE_{min,x}$ and $TE_{min,y}$ is determined. In Step S4 this maximum is set equal to the smallest possible echo time of the magnetic resonance system 5 if it is smaller than this smallest possible echo time. This maximum is the echo time which is worked with in the following Steps S5 and S6.

In Step S5 the phase coding gradient $G_x$ or, respectively, the phase coding gradient $G_y$ is determined via Equation (4), depending on the just discussed echo time TE and on the gradient moment $K_x$ or, respectively, $K_y$.

Both of the phase coding gradients $G_x$, $G_y$ that are determined in such a manner are switched in the next Step S6. After an RF excitation with slice selection, essentially one raw data point is read out after the echo time TE.

In Step S7 it is checked whether the current k-space line has been completely read out. If this is not the case, in Step S9 the gradient moment $K_x$ is modified accordingly and the method returns to Step S2. If the current k-space line has been completely read out ("yes" in Step S7) it is checked in Step S8 whether the k-space slice has also been completely read out. If this is the case, the method is ended. If the k-space slice has not yet been completely read out ("no" in Step S8), in Step S10 the gradient moment $K_x$ is reinitialized and in Step S11 the gradient moment $K_y$ is modified accordingly and the method returns to Step S2.

A sequence to read out the raw data points of a k-space line in Cartesian-scanned k-space is shown in FIG. 4. In addition to the RF excitation pulses 16 and the readout time periods 17, the curve of three phase coding gradients $G_x$, $G_y$ and $G_z$ is shown. In contrast to the method according to the invention that is shown in FIG. 3, the sequence shown in FIG. 4 does not work with a slice selection; rather, all three spatial directions (x, y and z) are spatially coded by means of the three phase coding gradients $G_x$, $G_y$ and $G_z$.

As can be seen from FIG. 4, at the raw data points at the beginning of the k-space line only the phase coding gradient $G_y$ can be switched to the maximum value while the phase coding gradients $G_x$ and $G_z$ have relatively low strengths. The echo time (which in FIG. 4 is apparent from the time interval between the respective RF excitation pulse 16 and the subsequent readout time period 17) therefore has a relatively long time period in order to not violate the Nyquist theorem (see Equation (1)). The closer that the raw data points to be acquired approach the k-space center, the greater the strength of all three phase coding gradients $G_x$, $G_y$ and $G_z$. Since the echo time is shorter the weaker that the strongest of the three phase coding gradients $G_x$, $G_y$ and $G_z$ is, the echo time is smallest at the acquisition of the raw data points in proximity to the k-space center, which can likewise be learned from FIG. 4.

While only one sequence to acquire a k-space line is shown in FIG. 4, FIG. 5 shows the curve of the three phase coding gradients $G_x$, $G_y$ and $G_z$ to acquire the entirety of k-space. In the sequence shown in FIG. 5, k-space is scanned by means of eight slices, which is apparent from the curve of the phase coding gradient $G_z$.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to create a magnetic resonance image data set, comprising the steps of:

operating a magnetic resonance data acquisition unit, in which a subject is located, to radiate an RF excitation pulse that causes magnetic resonance signals to be emitted from the subject;

activating at least two phase coding gradients in respective spatial directions that phase code said magnetic resonance signals, each of said at least two phase coding gradients having a gradient strength;

in a readout procedure, reading out said magnetic resonance signals as substantially only one raw data point in a k-space data set representing said magnetic resonance image data, at a predetermined time duration following radiation of said RF excitation pulse;

setting said predetermined time duration as a maximum of a set of respective maximum time periods for each of said at least two phase coding gradients;

setting a minimum time duration $TE_{min}$ for each of said at least two phase coding gradients dependent on the gradient strength of the respective phase coding gradients in order to comply with the Nyquist theorem;

repeatedly activating said at least two phase coding gradients and radiating said RF excitation pulse and reading out substantially only one raw data point until an entirety of said k-space data set is acquired; and setting said minimum time period $TE_{min}$ for each spatial direction according to:

$$TE_{min,i} = \frac{K_i}{G_{max,i}},$$

wherein i is the spatial direction of the respective phase coding direction, $K_i$ is the gradient moment of the respective phase coding gradient in the i spatial direction, and $G_{max,i}$ is the gradient strength of the respective phase coding gradient in the i spatial direction.

2. A method as claimed in claim 1 comprising setting said maximum strength $G_{max,i}$ in the i spatial direction to equal a maximum possible strength that can be generated by said magnetic resonance data acquisition unit.

3. A method as claimed in claim 2 comprising setting one of said at least two phase coding gradients to said maximum possible strength to implement said readout procedure.

4. A method as claimed in claim 1 comprising setting each of said at least two phase coding gradients to comply with $$G_i = \frac{K_i}{TE},$$

wherein TE is a time duration during which said at least one raw data point is read out after radiation of said RF excitation pulse.

5. A method as claimed in claim 1 comprising activating said at least two phase coding gradients while said RF excitation pulse is radiated.

6. A method as claimed in claim 1 comprising:
setting said gradient moment for each of said spatial directions to correspond to a standard procedure for each raw data point in said k-space data set;
acquiring each raw data point by determining, for each spatial direction, a minimum echo time in said standard procedure starting from the gradient moment predetermined for the respective raw data point;
determining a maximum echo time from said minimum echo time for each spatial direction; and
configuring each of said at least two phase coding gradients dependent on the gradient moment of the respective spatial direction and the maximum echo time.

7. A method as claimed in claim 6 comprising setting said maximum echo time to a smallest possible echo time of the magnetic resonance data acquisition unit, when the maximum echo time is smaller than said smallest possible echo time.

8. A method as claimed in claim 1 comprising setting a time period from radiation of said RF excitation pulse to read out of any of said raw data points to be not less than a limit that is predetermined dependent on said magnetic resonance data acquisition unit.

9. A method to create a magnetic resonance image data set, comprising the steps of:
operating a magnetic resonance data acquisition unit, in which a subject is located, to radiate an RF excitation pulse that causes magnetic resonance signals to be emitted from the subject;
activating at least two phase coding gradients in respective spatial directions that phase code said magnetic resonance signals, each of said at least two phase coding gradients having a gradient strength;
in a readout procedure, reading out said magnetic resonance signals as multiple raw data points along a straight spoke proceeding through a center of k-space, in a k-space data set representing said magnetic resonance image data, at a predetermined time duration following radiation of said RF excitation pulse;
setting said predetermined time duration as a maximum of a set of respective maximum time periods for each of said at least two phase coding gradients;
setting a minimum time duration $TE_{min}$ for each of said at least two phase coding gradients dependent on the gradient strength of the respective phase coding gradients in order to comply with the Nyquist theorem;
repeatedly activating said at least two phase coding gradients and radiating said RF excitation pulse and reading out multiple raw data points along respective spokes until an entirety of said k-space data set is acquired; and
setting said minimum time period $TE_{min}$ for each spatial direction according to:

$$TE_{min,i} = \frac{K_i}{G_{max,i}},$$

wherein i is the spatial direction of the respective phase coding direction, $K_i$ is the gradient moment of the respective phase coding gradient in the i spatial direction, and $G_{max,i}$ is the gradient strength of the respective phase coding gradient in the i spatial direction.

10. A method as claimed in claim 9 comprising setting said maximum strength $G_{max,i}$ in the i spatial direction to equal a maximum possible strength that can be generated by said magnetic resonance data acquisition unit.

11. A method as claimed in claim 10 comprising setting one of said at least two phase coding gradients to said maximum possible strength to implement said readout procedure.

12. A method as claimed in claim 9 comprising setting each of said at least two phase coding gradients to comply with $$G_i = \frac{K_i}{TE},$$

wherein TE is a time duration during which said at least one raw data point is read out after radiation of said RF excitation pulse.

13. A method as claimed in claim 9 comprising activating said at least two phase coding gradients while said RF excitation pulse is radiated.

14. A method as claimed in claim 9 comprising:
setting said gradient moment for each of said spatial directions to correspond to a standard procedure for each raw data point in said k-space data set;
acquiring each raw data point by determining, for each spatial direction, a minimum echo time in said standard procedure starting from the gradient moment predetermined for the respective raw data point;
determining a maximum echo time from said minimum echo time for each spatial direction; and
configuring each of said at least two phase coding gradients dependent on the gradient moment of the respective spatial direction and the maximum echo time.

15. A method as claimed in claim 14 comprising setting said maximum echo time to a smallest possible echo time of the magnetic resonance data acquisition unit, when the maximum echo time is smaller than said smallest possible echo time.

16. A method as claimed in claim 9 comprising setting a time period from radiation of said RF excitation pulse to read out of any of said raw data points to be not less than a limit that is predetermined dependent on said magnetic resonance data acquisition unit.

17. A magnetic resonance system that creates a magnetic resonance image data set comprising:
a magnetic resonance data acquisition unit;
a computerized control unit configured to operate said magnetic resonance data acquisition unit, in which a subject is located, to radiate an RF excitation pulse that causes magnetic resonance signals to be emitted from the subject;
said control unit being configured to operate said magnetic resonance data acquisition unit by activating at least two phase coding gradients in respective spatial directions that phase code said magnetic resonance signals, each of said at least two phase coding gradients having a gradient strength;
said control unit being configured to operate said magnetic resonance data acquisition unit by, in a readout procedure, reading out said magnetic resonance signals as substantially only one raw data point in a k-space data set representing said magnetic resonance image data, at a predetermined time duration following radiation of said RF excitation pulse;
said control unit being configured to operate said magnetic resonance data acquisition unit by setting said predetermined time duration as a maximum of a set of respective maximum time periods for each of said at least two phase coding gradients;
said control unit being configured to operate said magnetic resonance data acquisition unit by setting a minimum time duration $TE_{min}$ for each of said at least two phase coding gradients dependent on the gradient strength of the respective phase coding gradients in order to comply with the Nyquist theorem;
said control unit being configured to operate said magnetic resonance data acquisition unit by repeatedly activating said at least two phase coding gradients and radiating said RF excitation pulse and reading out substantially only one raw data point until an entirety of said k-space data set is acquired; and
said control unit being configured to operate said magnetic resonance data acquisition unit by setting said minimum time period $TE_{min}$ for each spatial direction according to:

$$TE_{min,i} = \frac{K_i}{G_{max,i}},$$

wherein i is the spatial direction of the respective phase coding direction, $K_i$ is the gradient moment of the respective phase coding gradient in the i spatial direction, and $G_{max,i}$ is the gradient strength of the respective phase coding gradient in the i spatial direction.

18. A magnetic resonance system as claimed in claim 17 wherein said control unit is configured to operate said magnetic resonance data acquisition unit by setting said maximum strength $G_{max,i}$ in the i spatial direction to equal a maximum possible strength that can be generated by said magnetic resonance data acquisition unit.

19. A magnetic resonance system as claimed in claim 18 wherein said control unit is configured to operate said magnetic resonance data acquisition unit by setting one of said at least two phase coding gradients to said maximum possible strength to implement said readout procedure.

20. A magnetic resonance system as claimed in claim 17 wherein said control unit is configured to operate said magnetic resonance data acquisition unit by setting each of said at least two phase coding gradients to comply with $$G_i = \frac{K_i}{TE},$$

wherein TE is a time duration during which said at least one raw data point is read out after radiation of said RF excitation pulse.

21. A magnetic resonance system as claimed in claim 17 wherein said control unit is configured to operate said magnetic resonance data acquisition unit by activating said at least two phase coding gradients while said RF excitation pulse is radiated.

22. A magnetic resonance system as claimed in claim 17 wherein said control unit is configured to operate said magnetic resonance data acquisition unit by:
setting said gradient moment for each of said spatial directions to correspond to a standard procedure for each raw data point in said k-space data set;
acquiring each raw data point by determining, for each spatial direction, a minimum echo time in said standard procedure starting from the gradient moment predetermined for the respective raw data point;
determining a maximum echo time from said minimum echo time for each spatial direction; and
configuring each of said at least two phase coding gradients dependent on the gradient moment of the respective spatial direction and the maximum echo time.

23. A magnetic resonance system as claimed in claim 22 wherein said control unit is configured to operate said magnetic resonance data acquisition unit by setting said maximum echo time to a smallest possible echo time of the magnetic resonance data acquisition unit, when the maximum echo time is smaller than said smallest possible echo time.

24. A magnetic resonance system as claimed in claim 17 wherein said control unit is configured to operate said magnetic resonance data acquisition unit by setting a time period from radiation of said RF excitation pulse to read out of any of said raw data points to be not less than a limit that is predetermined dependent on said magnetic resonance data acquisition unit.

25. A magnetic resonance system that creates a magnetic resonance image data set, comprising:
a magnetic resonance data acquisition unit;
a computerized control unit configured to operate said magnetic resonance data acquisition unit, in which a subject is located, to radiate an RF excitation pulse that causes magnetic resonance signals to be emitted from the subject;
said control unit being configured to operate said magnetic resonance data acquisition unit by activating at least two phase coding gradients in respective spatial directions that phase code said magnetic resonance signals, each of said at least two phase coding gradients having a gradient strength;
said control unit being configured to operate said magnetic resonance data acquisition unit by, in a readout procedure, reading out said magnetic resonance signals as multiple raw data points along a straight spoke proceeding through a center of k-space, in a k-space data set representing said magnetic resonance image data, at a predetermined time duration following radiation of said RF excitation pulse;

said control unit being configured to operate said magnetic resonance data acquisition unit by setting said predetermined time duration as a maximum of a set of respective maximum time periods for each of said at least two phase coding gradients;

said control unit being configured to operate said magnetic resonance data acquisition unit by setting a minimum time duration $TE_{min}$ for each of said at least two phase coding gradients dependent on the gradient strength of the respective phase coding gradients in order to comply with the Nyquist theorem;

said control unit being configured to operate said magnetic resonance data acquisition unit by repeatedly activating said at least two phase coding gradients and radiating said RF excitation pulse and reading out multiple raw data points along respective spokes until an entirety of said k-space data set is acquired; and said control unit being configured to operate said magnetic resonance data acquisition unit by setting said minimum time period $TE_{min}$ for each spatial direction according to:

$$TE_{min,i} = \frac{K_i}{G_{max,i}},$$

wherein i is the spatial direction of the respective phase coding direction, $K_i$ is the gradient moment of the respective phase coding gradient in the i spatial direction, and $G_{max,i}$ is the gradient strength of the respective phase coding gradient in the i spatial direction.

26. A magnetic resonance system as claimed in claim 25 wherein said control unit is configured to operate said magnetic resonance data acquisition unit by setting said maximum strength $G_{max,i}$ in the i spatial direction to equal a maximum possible strength that can be generated by said magnetic resonance data acquisition unit.

27. A magnetic resonance system as claimed in claim 26 wherein said control unit is configured to operate said magnetic resonance data acquisition unit by setting one of said at least two phase coding gradients to said maximum possible strength to implement said readout procedure.

28. A magnetic resonance system as claimed in claim 25 wherein said control unit is configured to operate said magnetic resonance data acquisition unit by setting each of said at least two phase coding gradients to comply with $$G_i = \frac{K_i}{TE},$$

wherein TE is a time duration during which said at least one raw data point is read out after radiation of said RF excitation pulse.

29. A magnetic resonance system as claimed in claim 25 wherein said control unit is configured to operate said magnetic resonance data acquisition unit by activating said at least two phase coding gradients while said RF excitation pulse is radiated.

30. A magnetic resonance system as claimed in claim 25 wherein said control unit is configured to operate said magnetic resonance data acquisition unit by:

setting said gradient moment for each of said spatial directions to correspond to a standard procedure for each raw data point in said k-space data set;

acquiring each raw data point by determining, for each spatial direction, a minimum echo time in said standard procedure starting from the gradient moment predetermined for the respective raw data point;

determining a maximum echo time from said minimum echo time for each spatial direction; and configuring each of said at least two phase coding gradients dependent on the gradient moment of the respective spatial direction and the maximum echo time.

31. A magnetic resonance system as claimed in claim 30 wherein said control unit is configured to operate said magnetic resonance data acquisition unit by setting said maximum echo time to a smallest possible echo time of the magnetic resonance data acquisition unit, when the maximum echo time is smaller than said smallest possible echo time.

32. A magnetic resonance system as claimed in claim 25 wherein said control unit is configured to operate said magnetic resonance data acquisition unit by setting a time period from radiation of said RE excitation pulse to read out of any of said raw data points to be not less than a limit that is predetermined dependent on said magnetic resonance data acquisition unit.

* * * * *